(12) United States Patent
Löffler

(10) Patent No.: US 7,401,179 B2
(45) Date of Patent: Jul. 15, 2008

(54) INTEGRATED CIRCUIT INCLUDING A MEMORY HAVING LOW INITIAL LATENCY

(75) Inventor: Steffen Löffler, Essex, VT (US)

(73) Assignee: Infineon Technologies AG, Munich (DE)

( * ) Notice: Subject to any disclaimer, the term of this patent is extended or adjusted under 35 U.S.C. 154(b) by 406 days.

(21) Appl. No.: 11/040,630

(22) Filed: Jan. 21, 2005

(65) Prior Publication Data

US 2006/0168417 A1 Jul. 27, 2006

(51) Int. Cl.
*G06F 13/28* (2006.01)
(52) U.S. Cl. ...................................... 711/104
(58) Field of Classification Search .................. 711/104
See application file for complete search history.

(56) References Cited

U.S. PATENT DOCUMENTS

| 6,091,663 | A  | * | 7/2000 | Kim et al. ................. 365/233 |
| 6,111,814 | A  |   | 8/2000 | Schaefer |
| 6,201,760 | B1 |   | 3/2001 | Yun et al. |
| 6,724,686 | B2 | * | 4/2004 | Ooishi et al. .............. 365/233 |
| 6,777,980 | B2 | * | 8/2004 | Young et al. ................ 326/41 |
| 6,996,016 | B2 | * | 2/2006 | Oh .......................... 365/193 |
| 2002/0062420 | A1 | * | 5/2002 | Mclaughlin et al. ......... 711/100 |
| 2004/0024955 | A1 | * | 2/2004 | Patel ........................ 711/100 |

* cited by examiner

*Primary Examiner*—Kevin L Ellis
(74) *Attorney, Agent, or Firm*—Dicke, Billig & Czaja, PLLC

(57) ABSTRACT

A random access memory comprises an array of memory cells and a controller. The controller is configured to access the array of memory cells in a double data rate prefetch mode in response to a read command and in a single data rate mode after the first double data rate access is completed.

25 Claims, 3 Drawing Sheets

INTEGRATED CIRCUIT INCLUDING A MEMORY HAVING LOW INITIAL LATENCY

BACKGROUND

One type of memory known in the art is Dynamic Random Access Memory (DRAM). One type of DRAM is Single Data Rate (SDR) Synchronous DRAM (SDRAM). In SDR SDRAM, read and write operations are synchronized to a system clock. The system clock is supplied by a host system that includes the SDR SDRAM. Operations are performed on the rising edges of the system clock. SDR SDRAM uses a single data rate architecture. The single data rate architecture has an interface designed to transfer one data word per clock cycle at the data input/output (I/O) pads or pins (DQs). A single read or write access for the SDR SDRAM effectively consists of a single n bit wide, one clock cycle data transfer at the internal memory array and a corresponding n bit wide, one clock cycle data transfer at the DQs.

Another type of DRAM is Double Data Rate (DDR) SDRAM. In DDR SDRAM, the read and write operations are synchronized to a system clock. The system clock is supplied by a host system that includes the DDR SDRAM. Operations are performed on both the rising and falling edges of the system clock. DDR SDRAM uses a double data rate architecture to achieve high speed operation. The double data rate architecture is essentially a 2n prefetch architecture with an interface designed to transfer two data words per clock cycle at the DQs. A single read or write access for the DDR SDRAM effectively consists of a single 2n bit wide, one clock cycle data transfer at the internal memory array and two corresponding n bit wide, one half clock cycle data transfers at the DQs.

Read and write accesses to SDR SDRAM and DDR SDRAM are burst oriented. Accesses start at a selected location and continue for a programmed number of locations in a programmed sequence. Accesses begin with the registration of an activate command, which is followed by a read or write command. The address bits registered coincident with the activate command are used to select the bank and row to be accessed. The address bits registered coincident with the read or write command are used to select the bank and the starting column location for the burst access.

A Column Address Strobe (CAS) signal is used to latch in the column addresses for selected memory cells and initiate a column access during a read or write operation. The delay between an activate command and the first read command is referred to as the RAS to CAS Delay ($t_{RCD}$). The delay between CAS pulses during a burst is referred to as the CAS to CAS Delay ($t_{CCD}$). In both SDR SDRAM and DDR SDRAM, $t_{RCD}$ and $t_{CCD}$ cannot be shorter than minimum times, which are limited by the processing speed of the memory circuit. If $t_{RCD}$ and $t_{CCD}$ are shorter than the minimum times, the memory circuit may fail.

Another type of DRAM is Pseudo-Static Random Access Memory (PSRAM). PSRAM is a low power DRAM having a Static Random Access Memory (SRAM) interface for wireless applications. PSRAMs do not have a separate activate command. The activate command in PSRAMs is automatically executed with a read or write command. Typically, the first access to a memory array of a PSRAM is asynchronous. The read command is typically decoded asynchronously and the initial CAS pulse after the asynchronously decoded read command is issued asynchronously. The subsequent CAS pulses for a burst access after the initial CAS pulse are issued synchronously with the clock. The position of the initial asynchronous CAS pulse can vary with respect to the next, synchronous CAS pulse. The time required to read data out of the memory array is typically longer than a clock period. This delay is referred to as the initial latency, which is the delay between a read command being issued and the first data provided at the DQs.

In PSRAMs, as in SDR SDRAMs and DDR SDRAMs, the $t_{CCD}$ needs to be longer than a minimum time, otherwise the PSRAM may fail. Since the initial CAS pulse is issued asynchronously, the initial CAS pulse and the next, synchronous CAS pulse may move too close together, violating the minimum $t_{CCD}$ requirement, depending on the clock period and the speed of the asynchronous command decode. For typical PSRAMs operating at higher clock speeds, a longer initial latency may be required to maintain the minimum $t_{RCD}$ and $t_{CCD}$ requirements to prevent a memory failure.

SUMMARY

One embodiment of the present invention provides a random access memory. The random access memory comprises an array of memory cells and a controller. The controller is configured to access the array of memory cells in a double data rate prefetch mode in response to a read command and in a single data rate mode after the first double data rate access is completed.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
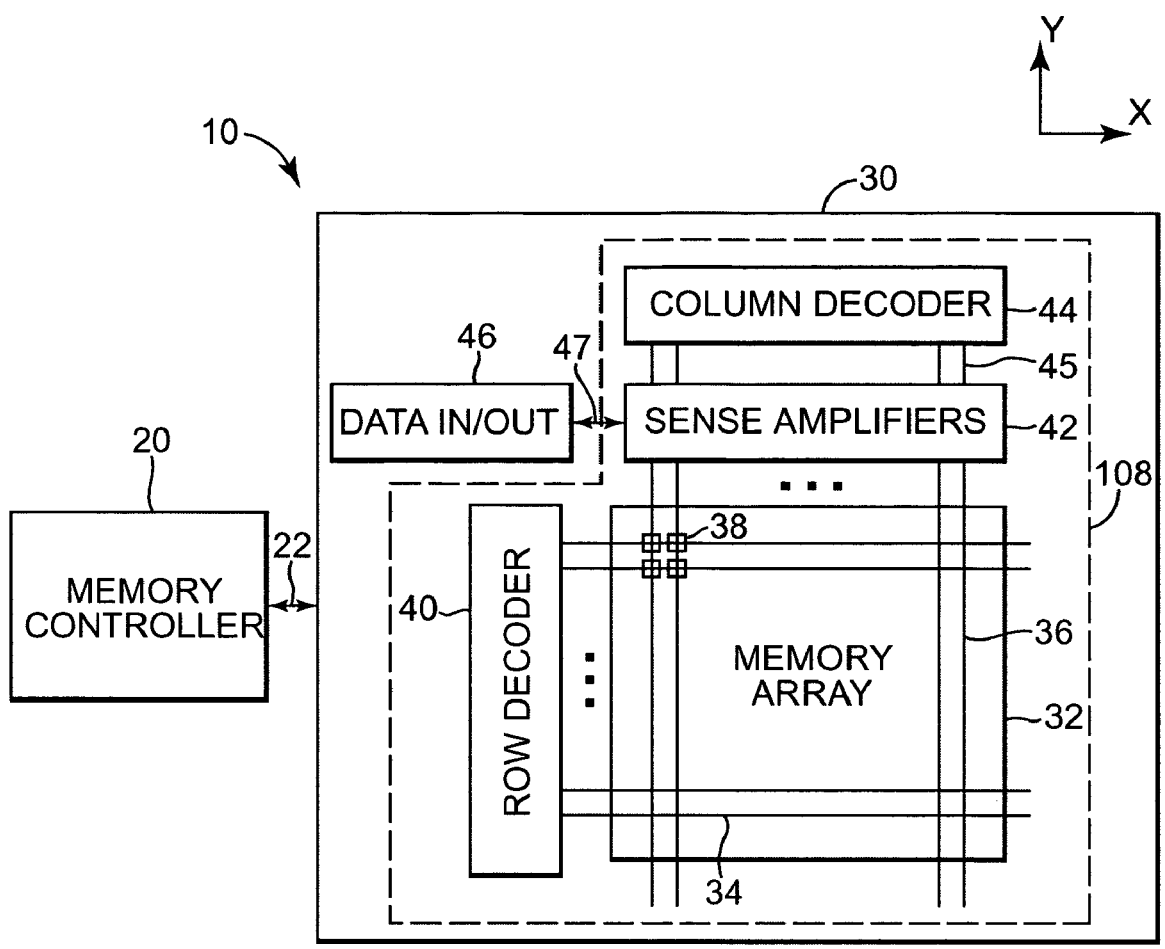
FIG. 1 is a block diagram illustrating one embodiment of a random access memory, according to the present invention.

FIG. 1 is a block diagram illustrating one embodiment of a random access memory 10. In one embodiment, random access memory 10 is a Pseudo-Static Random Access Memory (PSRAM). One type of PSRAM is CellularRAM, which is adapted for wireless applications. CellularRAM is a drop-in replacement for static random access memory (SRAM) and is based on a single transistor DRAM cell versus a six transistor SRAM cell.

PSRAM 10 includes a memory controller 20 and at least one memory bank 30. Memory bank 30 includes an array of memory cells 32, a row decoder 40, a column decoder 44, sense amplifiers 42, and data in/out circuit 46. Column decoder 44, sense amplifier 42, row decoder 40, and memory array 32 are herein collectively referred to as memory block 108. Memory controller 20 is electrically coupled to memory bank 30 through communication link 22.

PSRAM 10 is configured to access memory array 32 initially using a double data rate prefetch mode in response to a read command, which is decoded asynchronously. The initial read command is decoded and an initial asynchronous Column Address Strobe (CAS) pulse is issued that initiates the retrieval of 2n data bits (two data words) from memory array 32, where n equals the number of data input/output (I/O) pads or pins (DQs). After an initial latency, the first data word is output on a first rising edge of the system clock and the second data word is output on the next, second rising edge of the system clock. Subsequent synchronous CAS pulses are issued starting in response to the second rising edge of the system clock to retrieve data from memory array 32 in a single data rate mode. The synchronous CAS pulses initiate the retrieval of n data bits (one data word) per CAS pulse from memory array 32. The n data bits retrieved in response to each synchronous CAS pulse are output in response to rising edges of the system clock.

Conductive word lines 34, referred to as row select lines, extend in the x-direction across the array of memory cells 32. Conductive bit lines 36 extend in the y-direction across the array of memory cells 32. A memory cell 38 is located at each cross point of a word line 34 and a bit line 36. Each word line 34 is electrically coupled to row decoder 40, and each bit line 36 is electrically coupled to a sense amplifier 42. The sense amplifiers 42 are electrically coupled to column decoder 44 through conductive column decoder lines 45 and to data in/out circuit 46 through data lines 47.

Data in/out circuit 46 includes a plurality of latches and data input/output (I/O) pads or pins (DQs) to transfer data between memory bank 30 and an external device. Data to be written into memory bank 30 is presented as voltages on the DQs from an external device. The voltages are translated into the appropriate signals and stored in selected memory cells 38. Data read from memory bank 30 is presented by memory bank 30 on the DQs for an external device to retrieve. Data read from selected memory cells 38 appears at the DQs once access is complete and the output is enabled. At other times, the DQs are in a high impedance state.

Memory controller 20 controls reading data from and writing data to memory bank 30. During a read operation, memory controller 20 passes the row address of a selected memory cell or cells 38 to row decoder 40. Row decoder 40 activates the selected word line 34. As the selected word line 34 is activated, the value stored in each memory cell 38 coupled to the selected word line 34 is passed to the respective bit line 36. The value of each memory cell 38 is read by a sense amplifier 42 electrically coupled to the respective bit line 36. Memory controller 20 passes a column address of the selected memory cell or cells 38 to column decoder 44. Column decoder 44 selects which sense amplifiers 42 pass data to data in/out circuit 46 for retrieval by an external device.

During a write operation, the data to be stored in array 32 is placed in data in/out circuit 46 by an external device. Memory controller 20 passes the row address for the selected memory cell or cells 38 where the data is to be stored to row decoder 40. Row decoder 40 activates the selected word line 34. Memory controller 20 passes the column address for the selected memory cell or cells 38 where the data is to be stored to column decoder 44. Column decoder 44 selects which sense amplifiers 42 are passed the data from data in/out circuit 46. Sense amplifiers 42 write the data to the selected memory cell or cells 38 through bit lines 36.

Figure 2:
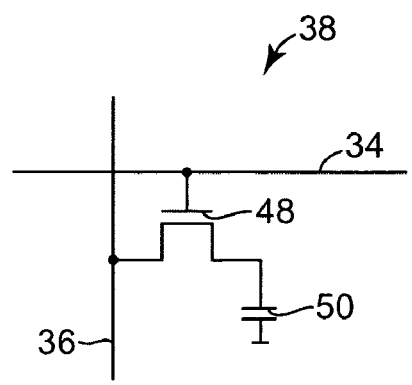
FIG. 2 is a diagram illustrating one embodiment of a memory cell.

FIG. 2 is a diagram illustrating one embodiment of one memory cell 38 in the array of memory cells 32. Memory cell 38 includes a transistor 48 and a capacitor 50. The gate of transistor 48 is electrically coupled to word line 34. The drain-source path of transistor 48 is electrically coupled to bit line 36 and capacitor 50. Capacitor 50 is charged to represent either a logic "0" or a logic "1." During a read operation, word line 34 is activated to turn on transistor 48 and the value stored on capacitor 50 is read by a corresponding sense amplifier 42 through bit line 36 and transistor 48. During a write operation, word line 34 is activated to turn on transistor 48 and the value stored on capacitor 50 is written by a corresponding sense amplifier 42 through bit line 36 and transistor 48.

The read operation on memory cell 38 is a destructive read operation. After each read operation, capacitor 50 is recharged with the value that was just read. In addition, even without read operations, the charge on capacitor 50 discharges over time. To retain a stored value, memory cell 38 is refreshed periodically by reading or writing the memory cell 38. All memory cells 38 within the array of memory cells 32 are periodically refreshed to maintain their values.

Figure 3:
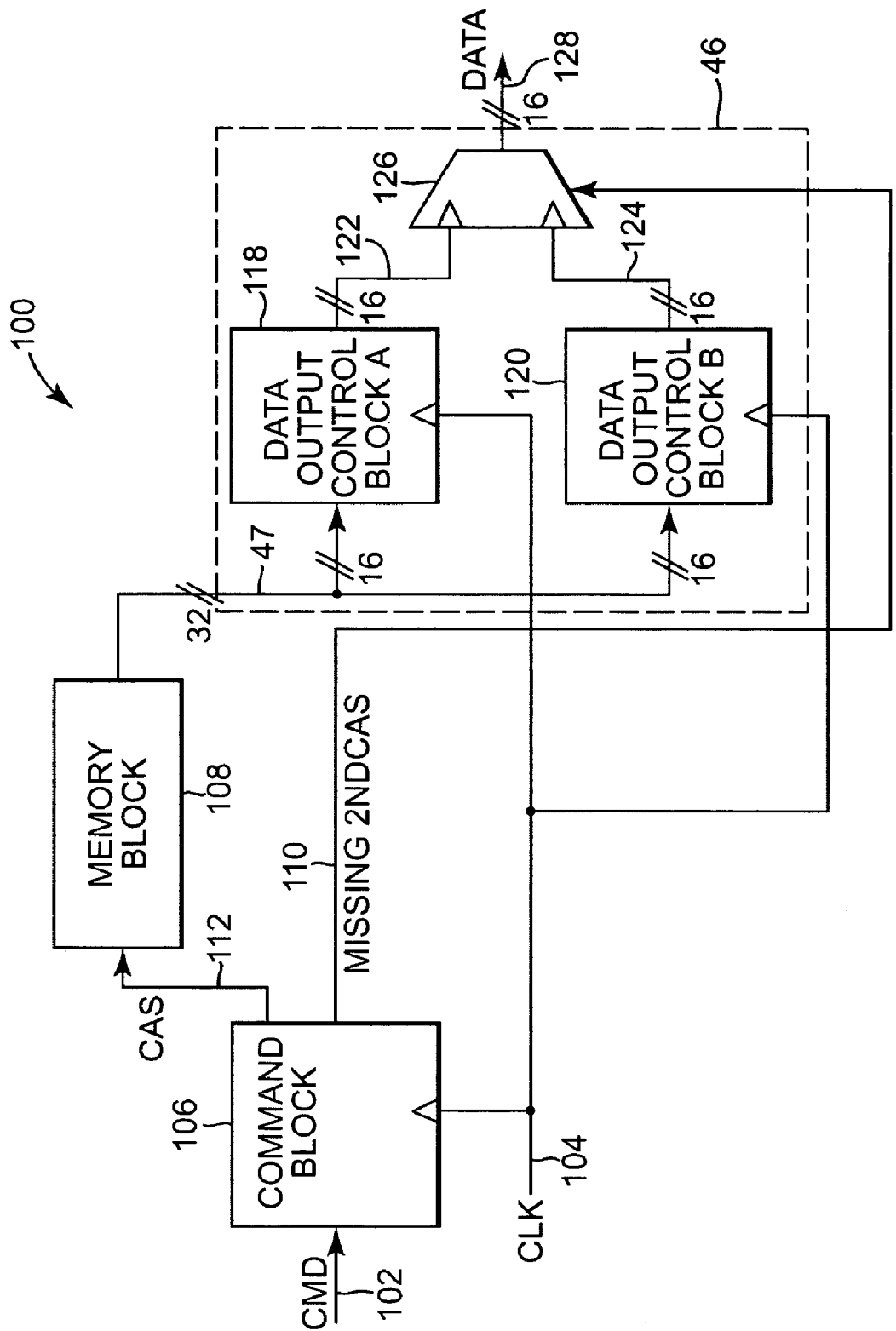
FIG. 3 is a block diagram illustrating one embodiment of a circuit for prefetching initial data in a random access memory.

FIG. 3 is a block diagram illustrating one embodiment of a circuit 100 for prefetching initial data in PSRAM 10. Circuit 100 includes command block 106, memory block 108, data output control block A 118, data output control block B 120, and multiplexer 126. In one embodiment, command block 106 is part of memory controller 20. In one form of the invention, data output control block A 118, data output control block B 120, and multiplexer 126 are part of data in/out circuit 46.

Command block 106 receives the command (CMD) signals on CMD signals path 102 and the clock (CLK) signal on CLK signal path 104. Command block 106 is electrically coupled to an input of memory block 108 through CAS signal path 112 and to the control input of multiplexer 126 through missing second CAS (MISSING2NDCAS) signal path 110. The output of memory block 108 is electrically coupled to the input of data output control block A 118 and the input of data output control block B 120 through data lines 47. The clock inputs of data output control block A 118 and data output control block B 120 receive the CLK signal on CLK signal path 104. The output of data output control block A 118 is electrically coupled to a first data input of multiplexer 126 through data lines 122. The output of data output control block B 120 is electrically coupled to a second data input of multiplexer 126 through data lines 124. Multiplexer 126 provides the data (DATA) signals on DATA lines 128.

Command block 106 receives the CMD signals on CMD signals path 102 and provides the CAS signal on CAS signal path 112 and the MISSING2NDCAS signal on MISSING2NDCAS signal path 110. In response to a read command on CMD signals path 102, command block 106 asynchronously decodes the read command and after a RAS to CAS Delay ($t_{RCD}$) issues an initial CAS pulse on CAS signal path 112 to memory block 108 to prefetch 2n data bits, where n is the number of DQs, in a manner similar to a Double Data Rate Synchronous Dynamic Random Access Memory (DDR SDRAM). In one embodiment, command block 106 issues the initial CAS pulse to memory block 108 to prefetch 32 bits of data.

Command block 106 issues a MISSING2NDCAS signal to multiplexer 126 in response to the first rising edge of the CLK signal after the initial CAS pulse. Command block 106 issues subsequent synchronous CAS pulses to memory block 108 in response to each subsequent rising edge of the CLK signal up to a burst length. In one embodiment, the subsequent CAS pulses are provided to memory block 108 to retrieve data in a manner similar to a Single Data Rate (SDR) SDRAM. In another embodiment, the subsequent CAS pulses are provided to memory block 108 to retrieve data in a manner similar to a DDR SDRAM, but the additional n data bits are ignored. In another embodiment, the subsequent CAS pulses are provided to memory block 108 to retrieve data in a manner similar to a DDR SDRAM, but every other CAS pulse is skipped and the MISSING2NDCAS signal is toggled to pass the correct data bits to DATA lines 128. In one embodiment, command block 106 issues subsequent CAS pulses in response to each subsequent rising edge of the CLK signal to retrieve 16 bits of data per CLK cycle.

Memory block 108 receives the CAS pulses on CAS signal path 112 and provides data on data lines 47. In response to the initial CAS pulse, memory block 108 reads 2n data bits from memory array 32 and provides the 2n data bits on data lines 47. In one embodiment, memory block 108 reads 32 data bits and provides the 32 data bits on data lines 47 in response to the initial CAS pulse. In response to the subsequent CAS pulses, memory block 108 reads n data bits from memory array 32 and provides the n data bits on the lower half of data lines 47. In one embodiment, memory block 108 reads 16 data bits from memory array 32 and provides the 16 data bits on the lower half of data lines 47 in response to the subsequent CAS pulses. In another embodiment, memory block 108 reads 2n data bits from memory array 32 in response to the subsequent CAS pulses, however, the upper n bits provided on data lines 47 are ignored. In another embodiment, where the subsequent CAS pulses are issued in a DDR SDRAM mode and every other CAS pulse is skipped, memory block 108 reads 2n data bits from memory array 32 in response to the subsequent CAS pulses and all 2n data bits are provided on data lines 47 based on the MISSING2NDCAS signal.

Data output control block A 118 receives the lower n data bits on data lines 47 from memory block 108 and passes the lower n data bits to multiplexer 126 through data lines 122. In one embodiment, data output control block A 118 receives the lower 16 data bits on data lines 47 from memory block 108 and passes the lower 16 data bits to multiplexer 126 through data lines 122. Data output control block A 118 passes the lower n data bits to multiplexer 126 in response to a rising edge of the CLK signal on CLK signal path 104.

Data output control block B 120 receives the upper n data bits on data lines 47 from memory block 108 and passes the upper n data bits to multiplexer 126 through data lines 124. In one embodiment, data output control block B 120 receives the upper 16 data bits on data lines 47 from memory block 108 and passes the upper 16 data bits to multiplexer 126 through data lines 124. Data output control block B 120 passes the upper n data bits to multiplexer 126 in response to a rising edge of the CLK signal on CLK signal path 104.

Multiplexer 126 receives the lower n data bits from data output control block A 118 through data lines 122 and the upper n data bits from data output control block B through data lines 124. Multiplexer 126 also receives the MISSING2NDCAS signal from command block 106 through MISSING2NDCAS signal path 110. In one embodiment, multiplexer 126 passes the lower n data bits to DATA lines 128 in response to a logic low MISSING2NDCAS signal. Multiplexer 126 passes the upper n data bits to DATA lines 128 in response to a logic high MISSING2NDCAS signal. In one embodiment, multiplexer 126 passes the lower 16 data bits to DATA lines 128 in response to a logic low MISSING2NDCAS signal and the upper 16 data bits to DATA lines 128 in response to a logic high MISSING2NDCAS signal.

In operation, command block 106 receives and asynchronously decodes a read command. In response to the read command, command block 106 issues an initial CAS pulse. Memory block 108 receives the initial CAS pulse and prefetches 2n data bits. Data output control block A 118 receives the lower n data bits and data output control block B 120 receives the upper n data bits. Multiplexer 126 passes the lower n data bits on data lines 122 to DATA lines 128 in response to a logic low MISSING2NDCAS signal. Command block 106 then transitions the MISSING2NDCAS signal to logic high. In response to the logic high MISSING2NDCAS signal, multiplexer 126 passes the upper n data bits on data lines 124 to DATA lines 128. Command block 106 then issues subsequent synchronous CAS pulses to memory block 108 and transitions the MISSING2NDCAS signal to logic low. Memory block 108 receives the subsequent CAS pulses and outputs n data bits per CAS pulse. Data output control block A 118 receives the n data bits. With the MISSING2NDCAS signal logic low, multiplexer 126 passes the n data bits from data output control block A 118 to DATA lines 128. Command block 106 continues to issue the subsequent CAS pulses up to the desired burst length. The timing of the MISSING2NDCAS signal is adjusted such that the respective data output from memory block 108 are valid during the specified data window.

Figure 4:
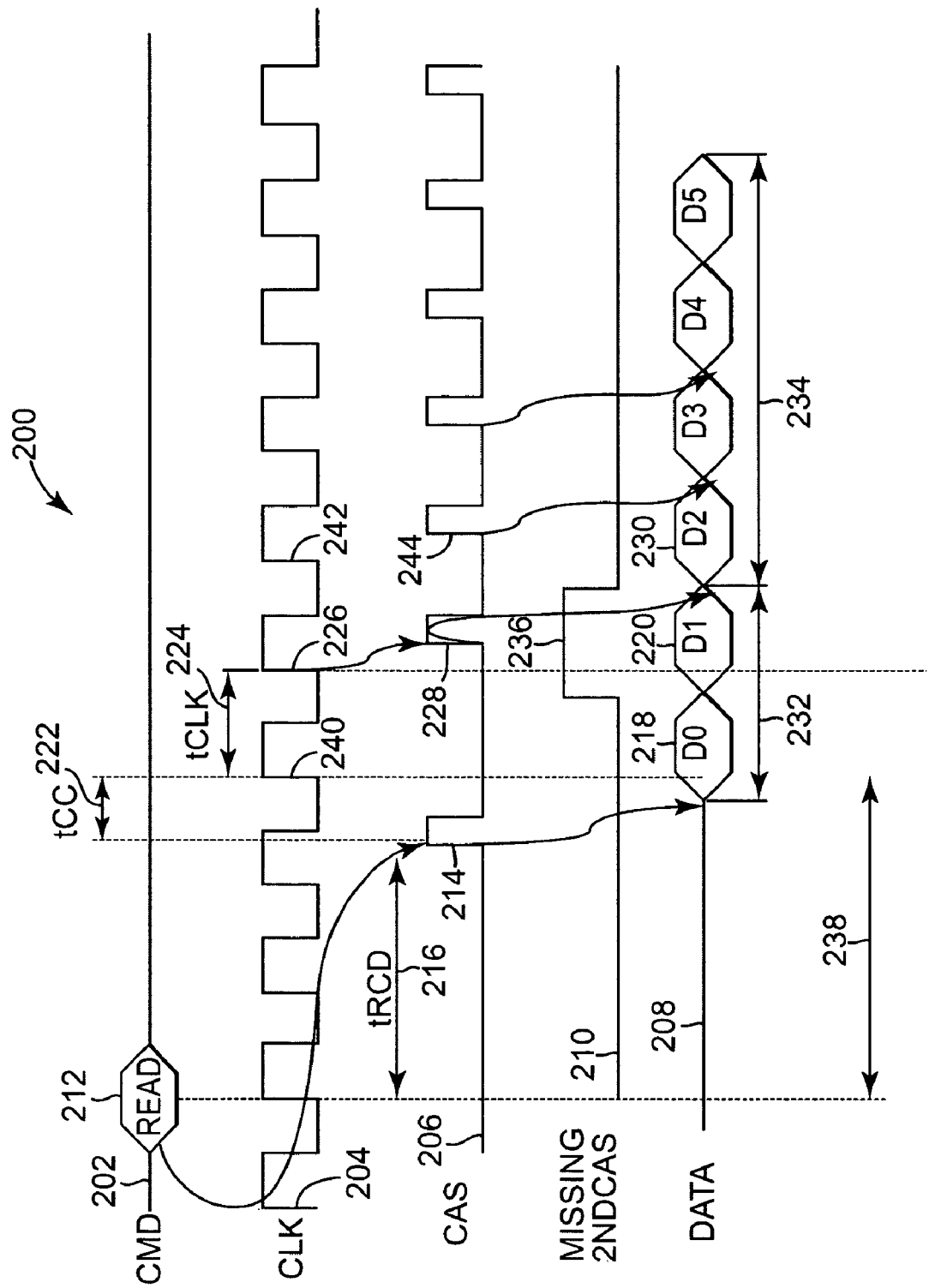
FIG. 4 is a timing diagram illustrating one embodiment of the timing of signals for the circuit for prefetching initial data in the random access memory.

FIG. 4 is a timing diagram 200 illustrating the timing of signals for circuit 100. Timing diagram 200 includes a CMD signal 202 on CMD signals path 102, CLK signal 204 on CLK signal path 104, CAS signal 206 on CAS signal path 112, MISSING2NDCAS signal 210 on MISSING2NDCAS signal path 110, and DATA signal 208 on DATA lines 128. The length of one clock cycle ($t_{CLK}$) is indicated at 224.

In response to read command 212 of CMD signal 202, command block 106 asynchronously decodes read command 212 and issues an initial asynchronous CAS pulse 214 a $t_{RCD}$ 216 after read command 212. In response to initial CAS pulse 214, memory block 108 provides 2n data bits (two data words) on data lines 47. Data output control block A 118 receives the lower n data bits (first data word) on data lines 47 and data output control block B 120 receives the upper n data bits (second data word) on data lines 47. Data output control block A 118 passes the lower n data bits to multiplexer 126 in response to rising edge 240 of CLK signal 204. With MISSING2NDCAS signal 210 logic low, multiplexer 126 passes the lower n data bits to DATA lines 128 as indicated by D0 data 218 of DATA signal 208. Initial CAS pulse 214 occurs a CAS to CLK time ($t_{CC}$) 222 before rising edge 240 of CLK signal 204 to ensure D0 data 218 is available in response to rising edge 240 of CLK signal 204. The initial latency between read command 212 and the output of D0 data 218 is indicated at 238.

Also in response to rising edge 240 of CLK signal 204, command block 106 provides pulse 236 of MISSING2NDCAS signal 210. In response to rising edge 226 of CLK signal 204, data output control block B 120 passes the upper n data bits to multiplexer 126. With MISSING2NDCAS signal 210 logic high, multiplexer 126 passes the upper n data bits to DATA lines 128 as indicated by D1 data 220 of DATA signal 208. The data output in response to asynchronous CAS pulse 214 includes D0 data 218 and D1 data 220 as is indicated at 232.

Also in response to rising edge 226 of CLK signal 204, command block 106 synchronously provides CAS pulse 228 of CAS signal 206. In one embodiment, in response to CAS pulse 228 of CAS signal 206, memory block 108 provides n data bits (one data word) on data lines 47. Data output control block A 118 receives the n data bits on data lines 47. Data output control block A 118 passes the n data bits to multiplexer 126. With MISSING2NDCAS signal 210 logic low, multiplexer 126 passes the n data bits to DATA lines 128 as indicated by D2 data 230 of DATA signal 208. The burst continues with command block 106 issuing a subsequent synchronous CAS pulse 244 in response to rising edge 242 of CLK signal 204. The data output in response to the synchronous CAS pulses includes the D2-D5 data as indicated at 234.

In another embodiment, in response to CAS pulse 228 of CAS signal 206, memory block 108 provides 2n data bits (two data words) on data lines 47. Data output control block A 118 receives the lower n data bits and data output control block B 120 receives the upper n data bits on data lines 47. Data output control block A 118 passes the lower n data bits to multiplexer 126, and data output control block B 120 passes the upper n data bits to multiplexer 126. With MISSING2NDCAS signal 210 logic low, multiplexer 126 passes the lower n data bits to DATA lines 128 as indicated by D2 data 230 of DATA signal 208. The upper n data bits are ignored. The burst continues with command block 106 issuing a subsequent synchronous CAS pulse 244 in response to rising edge 242 of CLK signal 204.

Embodiments of the present invention provide a system and method for reducing the initial latency of an asynchronously decoded read command in a PSRAM or CellularRAM. By using a DDR SDRAM prefetch mode to retrieve the initial two data words followed by a SDR SDRAM mode to retrieve the remaining data words of a burst access, the initial latency of the PSRAM can be reduced and the minimum $t_{CCD}$ time is not violated. The minimum $t_{CCD}$ is not violated since the first synchronous CAS pulse is issued more than one clock cycle after the initial asynchronous CAS pulse.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
an array of memory cells; and
a controller configured to access the array of memory cells in a double data rate prefetch mode and in a single data rate mode in response to a read command for a burst access,
wherein the burst access includes a double data rate access in the double data rate prefetch mode and a single data rate access in the single data rate mode.

2. The integrated circuit of claim 1, wherein the controller is configured to prefetch 2n data bits in the double data rate prefetch mode.

3. The integrated circuit of claim 2, wherein n equals 16.

4. The integrated circuit of claim 1, wherein the controller is configured to provide an initial asynchronous column address strobe to access the array of memory cells in the double data rate prefetch mode and synchronous column address strobes to access the array of memory cells in the single data rate mode.

5. A memory comprising:
an array of memory cells; and
a memory controller configured to access the array of memory cells in response to a read command for a burst access, the burst access including:
asynchronously prefetching a first data word and a second data word from the array of memory cells in a double rate prefetch mode; and
synchronously retrieving a third data word from the array of memory cells in a single data rate mode after asynchronously prefetching the first and second data words.

6. The memory of claim 5, wherein the memory controller is configured to provide an asynchronous column address strobe to initiate the asynchronous prefetch of the first data word and the second data word and provide a synchronous column address strobe to initiate the synchronous retrieval of the third data word.

7. The memory of claim 5, further comprising:
a data in/out circuit configured to output the first data word in response to a first rising edge of a clock signal, output the second data word in response to a second rising edge of the clock signal, and output the third data word in response to a third rising edge of the clock signal.

8. A memory comprising:
a memory block;
a command block configured to provide a first signal, a second signal, and a third signal in response to a read command for a burst access, the second signal provided in response to a first rising edge of a clock signal after the first signal, and the third signal provided in response to a second rising edge of the clock signal immediately following the first rising edge of the clock signal, the burst access including a double data rate access in a double data rate prefetch mode prior to a single data rate access in a single data rate mode;
a first data output control block configured to receive a lower n data bits from the memory block in response to the first signal in the double data rate prefetch mode and in response to the third signal in the single data rate mode;
a second data output control block configured to receive an upper n data bits from the memory block in response to the first signal; and
a multiplexer configured to selectively output one of the lower n data bits and the upper n data bits based on the second signal.

9. The memory of claim 8, wherein the first signal comprises an asynchronous column address strobe signal.

10. The memory of claim 8, wherein the second signal comprises a missing second column address strobe signal.

11. The memory of claim 8, wherein the third signal comprises a synchronous column address strobe signal.

12. The memory of claim 8, wherein the memory block comprises an array of dynamic random access memory cells.

13. A memory comprising:
a memory array; and
a circuit configured to access the memory array in a double data rate prefetch mode and in a single data rate mode in response to a read command for a burst access, the burst access including a double data rate access in the double data rate prefetch mode prior to a single data rate access in the single data rate mode, the circuit comprising:
means for receiving the read command for the burst access;
means for issuing an asynchronous column address strobe in the double data rate prefetch mode in response to the read command;
means for prefetching a first data word and a second data word from the memory array in response to the asynchronous column address strobe;
means for issuing a synchronous column address strobe in the single data rate mode after the asynchronous column address strobe; and
means for retrieving a third data word from the memory array in response to the synchronous column address strobe.

14. The memory of claim 13, wherein the circuit further comprises:
means for outputting the first data word in response to a first rising edge of a clock signal after the asynchronous column address strobe;

means for outputting the second data word in response to the second rising edge of the clock signal after the asynchronous column address strobe; and means for outputting the third data word in response to the third rising edge of the clock signal after the asynchronous column address strobe.

15. A method for accessing a memory, the method comprising:
receiving a read command for a burst access of a memory array; and
performing a burst access in response to the read command, the burst access comprising:
issuing an asynchronous column address strobe in a double data rate prefetch mode;
prefetching a first data word and a second data word from the memory array in response to the asynchronous column address strobe;
issuing a synchronous column address strobe in a single data rate mode after issuing the asynchronous column address strobe; and
retrieving a third data word from the memory array in response to the synchronous column address strobe.

16. The method of claim 15, wherein the burst access further comprises:
outputting the first data word in response to a first rising edge of a clock signal after the asynchronous column address strobe;
outputting the second data word in response to the second rising edge of the clock signal after the asynchronous column address strobe; and
outputting the third data word in response to the third rising edge of the clock signal after the asynchronous column address strobe.

17. The method of claim 15, wherein issuing the synchronous column address strobe comprises issuing the synchronous column address strobe more than one clock cycle after issuing the asynchronous column address strobe.

18. The method of claim 15, wherein prefetching the first data word and the second data word from the memory array comprises prefetching a first 16 bit data word and a second 16 bit data word from the memory array.

19. The method of claim 15, wherein retrieving the third data word from the memory array comprises retrieving a third 16 bit data word from the memory array.

20. A method for reading a memory, the method comprising:
receiving a read command for a burst access of a memory array; and
performing a burst access in response to the read command, the burst access including:
simultaneously prefetching a first data word and a second data word from the memory array in a double data rate mode;
outputting the first data word in response to a first rising edge of a clock signal;
outputting the second data word in response to a second rising edge of the clock signal;
retrieving a third data word from the memory array in a single data rate mode in response to the second rising edge of the clock signal; and
outputting the third data word in response to a third rising edge of the clock signal.

21. The method of claim 20, further comprising:
asynchronously decoding the read command.

22. The method of claim 20, further comprising:
issuing an asynchronous column address strobe in response to the read command; and
wherein prefetching the first data word and the second data word from the memory array comprises prefetching the first data word and the second data word from the memory array in response to the asynchronous column address strobe.

23. The method of claim 22, further comprising:
issuing a synchronous column address strobe in response to the second rising edge of the clock signal; and wherein retrieving the third data word from the memory array comprises retrieving the third data word from the memory array in response to the synchronous column address strobe.

24. A method for reading a memory, the method comprising:
receiving a read command for a burst access of a memory array; and
performing a burst access in response to the read command, the burst access including:
issuing an asynchronous column address strobe in a double data rate prefetch mode;
reading a first data word and a second data word in parallel from the memory array in response to the asynchronous column address strobe;
outputting the first data word in response to a first rising edge of a clock signal;
outputting the second data word in response to a second rising edge of the clock signal;
issuing a synchronous column address strobe in a single data rate mode in response to the second rising edge of the clock signal;
reading a third data word from the memory array in response to the synchronous column address strobe; and
outputting the third data word in response to a third rising edge of the clock signal.

25. The method of claim 24, wherein issuing the synchronous column address strobe comprises issuing the synchronous column address strobe more than one clock cycle after issuing the asynchronous column address strobe.

* * * * *